(12) United States Patent
Miura (10) Patent No.: US 7,193,685 B2
(45) Date of Patent: Mar. 20, 2007

(54) EXPOSURE APPARATUS

(75) Inventor: Seiya Miura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 329 days.

(21) Appl. No.: 11/011,570

(22) Filed: Dec. 14, 2004

(65) Prior Publication Data

US 2005/0128453 A1 Jun. 16, 2005

(30) Foreign Application Priority Data

Dec. 15, 2003 (JP) .............................. 2003-417052

(51) Int. Cl.
*G03B 27/52* (2006.01)
(52) U.S. Cl. ........................... 355/55; 355/53; 356/401
(58) Field of Classification Search ................ 355/53, 355/55, 72, 75, 77; 356/400, 401; 250/548
See application file for complete search history.

(56) References Cited

U.S. PATENT DOCUMENTS

| 5,286,963 A | * | 2/1994 | Torigoe | 250/201.2 |
| 6,023,320 A | * | 2/2000 | Kawashima | 355/53 |
| 2002/0145716 A1 | * | 10/2002 | Kurosawa | 355/55 |

FOREIGN PATENT DOCUMENTS

JP 5-45889 A 2/1993

* cited by examiner

*Primary Examiner*—Alan Mathews
(74) *Attorney, Agent, or Firm*—Morgan & Finnegan LLP (57) ABSTRACT

An exposure apparatus includes a projection optical system for projecting a pattern on a reticle mounted on a first stage onto an object mounted on a second stage, a first reference plate provided on the reticle or a surface equivalent to the reticle, the first reference plate having three or more first reference marks each of which serves as a reference for an alignment between the reticle and the object, a measuring unit for measuring focus position at imaging positions of the first reference marks and for measuring an image surface of the projection optical system, and a correcting unit for correcting a relationship between the image surface and a reference surface as a reference of a measurement by the measuring unit.

13 Claims, 13 Drawing Sheets

EXPOSURE APPARATUS

BACKGROUND OF THE INVENTION

The present invention relates generally to an exposure apparatus, and more particularly to an exposure apparatus used to manufacture various devices including semiconductor chips such as ICs and LSIs, display devices such as liquid crystal panels, sensing devices such as magnetic heads, and image pickup devices such as CCDs, as well as fine patterns used for micromechanics. The present invention is suitable, for example, for a step-and-scan exposure apparatus in the lithography process.

Conventionally employed reduction projection exposure apparatuses use a projection optical system to project or transfer a circuit pattern on a mask or a reticle onto a wafer, etc., in manufacturing such a fine semiconductor device as a semiconductor memory and a logic circuit in the photolithography technology.

Figure 13:
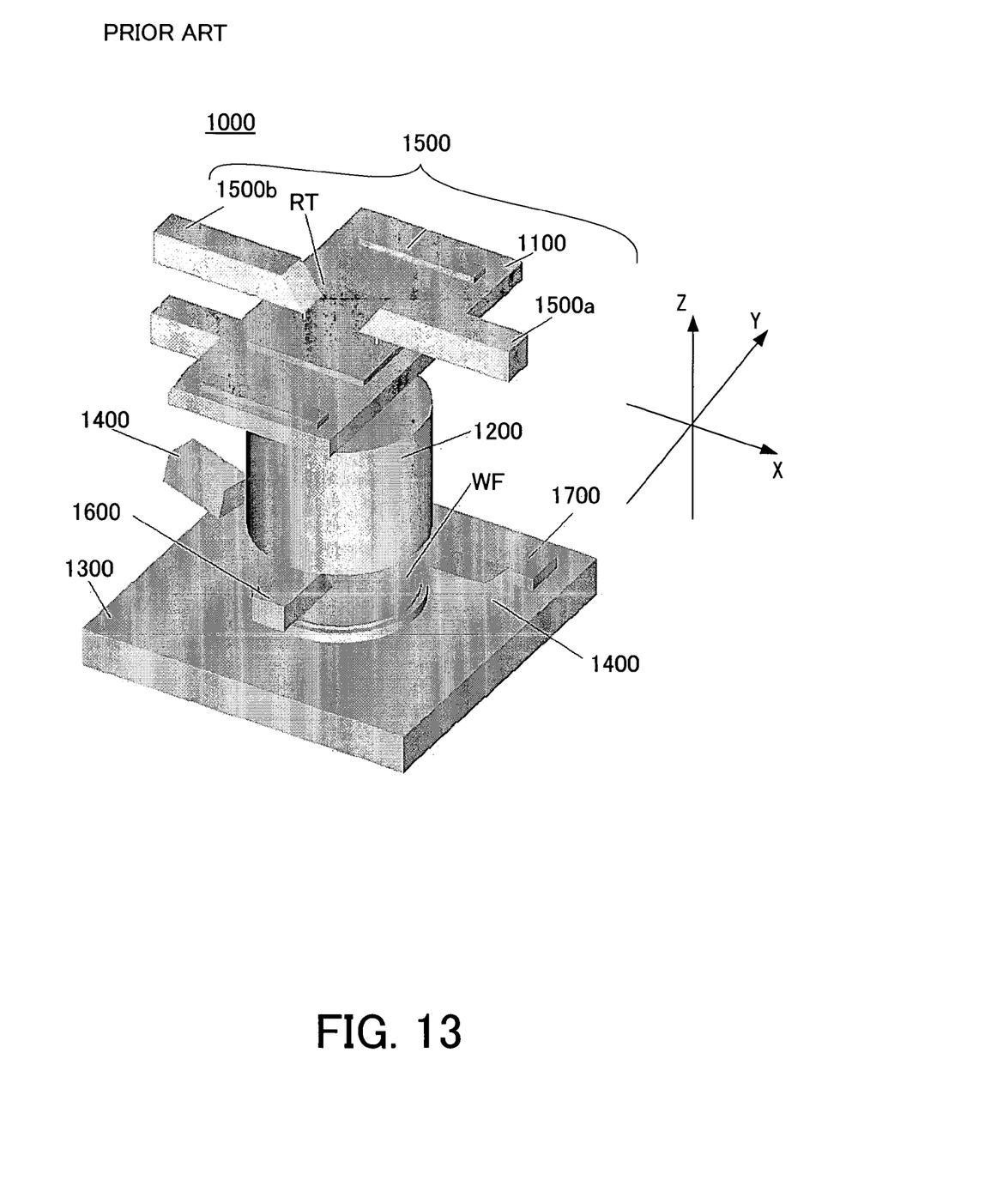
FIG. 13 is a schematic perspective view showing a structure of a conventional scanning exposure apparatus.

Recently, as shown in FIG. 13, in order to improve the resolution and enlarge the exposure apparatus, a scanning projection exposure apparatus (also referred to as a "scanner") has been conventionally used to expose part of the reticle RT continuously and expose the entire reticle pattern onto each exposure area on the wafer WF by synchronously scanning the reticle RT and the wafer WF relative to a projection optical system 1200 by using a reticle stage 1100 and a wafer stage 1300. FIG. 13 is a schematic perspective view showing a structure of the conventional scanning exposure apparatus 1000.

In order to align the reticle with the wafer during the exposure, the exposure apparatus includes plural alignment optical systems. For example, the alignment optical system is includes, as shown in FIG. 13, an off-axis alignment optical system 1600 that detects an alignment mark on the wafer WF for the alignments of the wafer, and a through the reticle ("TTR") alignment optical system 1500 that detects, via the projection optical system 1200, an alignment mark on the wafer WF corresponding to the alignment mark on the reticle RT. The TTR alignment optical system is also referred to as a through the lens ("TTL") alignment optical system.

A focus/leveling detecting system 1400 of an oblique incident system is configured as a wafer surface detecting means. The focus/leveling detecting system 1400 irradiates, via the projection optical system 1200, the light oblique to the wafer surface on which a pattern on the reticle RT is transferred (or a reference plate 1700 surface), and detects the reflected light reflected obliquely from the wafer surface or the reference plate 1700).

The focus detecting system 1400 includes as a detector a position detecting, light receiving element corresponding to the reflected light so that the light receiving surface of the position detecting light receiving element and the reflecting point of the light on the wafer WF are approximately conjugate to each other.

Therefore, a positional offset in the optical-axis direction of the projection optical system 1200 of the wafer WF (or the reference plate 1700) is measured as a positional offset on the position detecting light receiving element in the detector.

In particular, plural position detecting light receiving elements corresponding to plural rays are provided so as to detect leveling (or a tilt) as well as the focus. A light receiving surface of each position detecting light receiving element and the reflecting surface of each ray on the wafer WF are made approximately conjugate to each other. A tilt of the wafer WF (or a reference plate 1700) is measured from the focus measuring results at plural measuring points.

Te TTL optical system 1500 also serves as a focus calibration function for measuring errors caused by the measuring origin of the focus/leveling detecting system 1400 and the focal surface of the projection optical system 1200 when the projection optical system 1200 absorbs the exposure heat or the surrounding environment changes. The TTL optical system 1500 generally includes two optical systems 1500a and 1500b, and can measure focus states of the projection optical system 1200 at two points simultaneously.

The scanning exposure apparatus defines a rectangular or arc-shaped slit exposure area at the still time where a long side aligns with a direction orthogonal to a scan direction and a short side aligns with the scan direction, and deteriorates the resolution when the image surface of the projection optical system and the actual exposure surface or the wafer surface incline to each other in the long side direction.

Accordingly, the TTL optical system measures the focus state of the projection optical system at two points in the exposure slit so as to calculate the tilt of the image surface in the long side direction. Then, the good resolution performance is obtained by according the actual exposure surface with this tilt (see, for example, Japanese Patent Application No. 5-45889).

The recent high integration of the semiconductor devices demands the finer processing to patterns to be transferred or high resolution. The prior art has attempted to meet this requirement by using the exposure light having a short wavelength. However, only the short wavelength of the exposure light cannot satisfy the rapidly progressing integration of the semiconductor devices. For the high resolution, along with the short wavelength, the high numerical aperture ("NA") of the projection optical system has recently shifted from about 0.6 to 0.8 or higher.

This configuration, however, makes a depth of focus ("DOF") excessively small, and demands for the remarkably improved detecting accuracy of the focal point, in particular, improved accuracy of the focus calibration. As the DOF decreases, it is vital to measure the tilt of the image surface in the scan direction, which has been conventionally negligible, for example, to accord the actual exposure surface with the image surface of the projection optical system by driving the wafer stage, and to correctively accord the image surface side with the actual exposure surface by driving the lens, etc. in the projection optical system. It is possible to measure and correct the tilt of the image surface in the long side direction, as described above, in the conventional scanning exposure apparatus, but it is not possible to measure or correct the tile of the image surface in the scan direction.

When the focus/leveling detecting system's reference surface varies with time, the best exposure deteriorates. In order to correct this fluctuation, the focus/leveling detecting system is corrected on the basis of a so-called running surface by sequentially feeding the reference mark on the wafer stage to plural measuring points prior to the measurements. However, when the stage running surface does not accord with the tilt of the image surface of the projection optical system, the reference surface correction of the focus/leveling detecting system deteriorates.

The exposure apparatus is required to improve the throughput (or the number of sheets exposed per unit of time) for improved the productivity, and needs to shorten the measuring time while improving the measuring accuracy in the focus calibration.

BRIEF SUMMARY OF THE INVENTION

Accordingly, it is an exemplary object of the present invention to provide an exposure apparatus that realizes a highly precise focus calibration by measuring a tilt of an image surface in a scan direction, and provides exposure with a superior resolution without lowering a throughput.

An exposure apparatus according to one aspect of the present invention includes a projection optical system for projecting a pattern on a reticle mounted on a first stage onto an object mounted on a second stage, a first reference plate provided on the reticle or a surface equivalent to the reticle, the first reference plate having three or more first reference marks each of which serves as a reference for an alignment between the reticle and the object, a measuring unit for measuring focus position at imaging positions of the first reference marks and for measuring an image surface of the projection optical system, and a correcting unit for correcting a relationship between the image surface and a reference surface as a reference of a measurement by the measuring unit.

A device manufacturing method includes the steps of exposing an object using the above exposure apparatus, and developing the object that has been exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
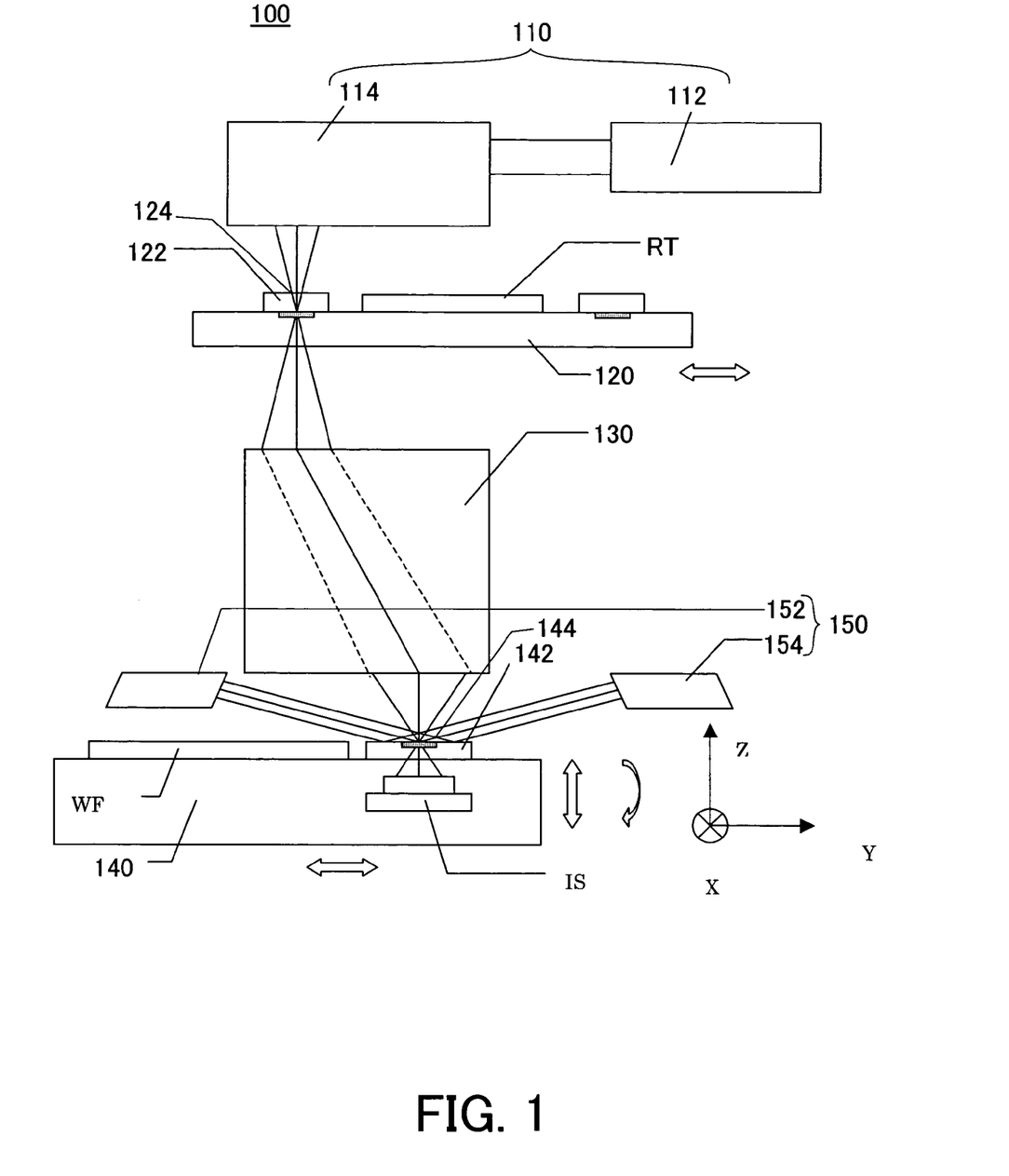
FIG. 1 is a schematic block diagram of a structure of an exposure apparatus according to one aspect of the present invention.

Referring now to the accompanying drawings, a description will be given of an exposure apparatus according to one aspect of the present invention. A like element in each figure is designated by the same reference numeral, and a duplicate description thereof will be omitted. Here, FIG. 1 is a schematic block diagram of the exposure apparatus 100 according to one aspect of the present invention.

The exposure apparatus 100 is a scanning exposure apparatus that exposes a circuit pattern on a reticle RT onto a wafer WF in a step and scan manner. This exposure apparatus is suitable for a sub-micron or quarter-micron lithography process. The exposure apparatus 100 includes, as shown in FIG. 1, an illumination apparatus 110, a reticle stage 120, a projection optical system 130, a wafer stage 140, and a focus/leveling detecting system 150.

The illumination apparatus 110 illuminates the reticle RT on which a circuit pattern to be transferred is formed, and includes a light source section 112 and an illumination optical system 114.

The light source section 112 includes, for example, a laser as a light source. The laser may be pulsed laser such as an ArF excimer laser with a wavelength of approximately 193 nm, a KrF excimer laser with a wavelength of approximately 248 nm, a $F_2$ laser with a wavelength of approximately 157 nm, etc. A kind of laser, the number of laser units, and a type of light source section is not limited.

The illumination optical system 114 is an optical system that introduces the light from the light source section 112 to the reticle RT, and includes a lens, a mirror, a light integrator, a stop, and the like. The light integrator may include a fly-eye lens or an integrator formed by stacking two sets of cylindrical lens array plates (or lenticular lenses), and be replaced with an optical rod or a diffractive element. The illumination optical system 114 may use both on-axis light and off-axis light.

The reticle RT has a circuit pattern (or an image) to be transferred. The reticle RT is made, for example, of quartz and supported and driven by the reticle stage 120. The reticle RT and wafer WF are located in an optically conjugate relationship through the projection optical system 130. The illumination optical system 114 forms a rectangular or arc-shaped slit illumination area on the reticle RT, which is long in X direction.

The reticle stage 120 supports the reticle RT, is connected to a drive mechanism (not shown), and controls driving of the reticle RT. The reticle stage 120 and the projection optical system 130 are provided on a barrel stool supported via a damper, for example, to the base frame placed on the floor. The drive mechanism (not shown) includes a linear motor and the like, and drives the reticle stage 120 in XY directions, thus moving the reticle RT.

Figure 2:
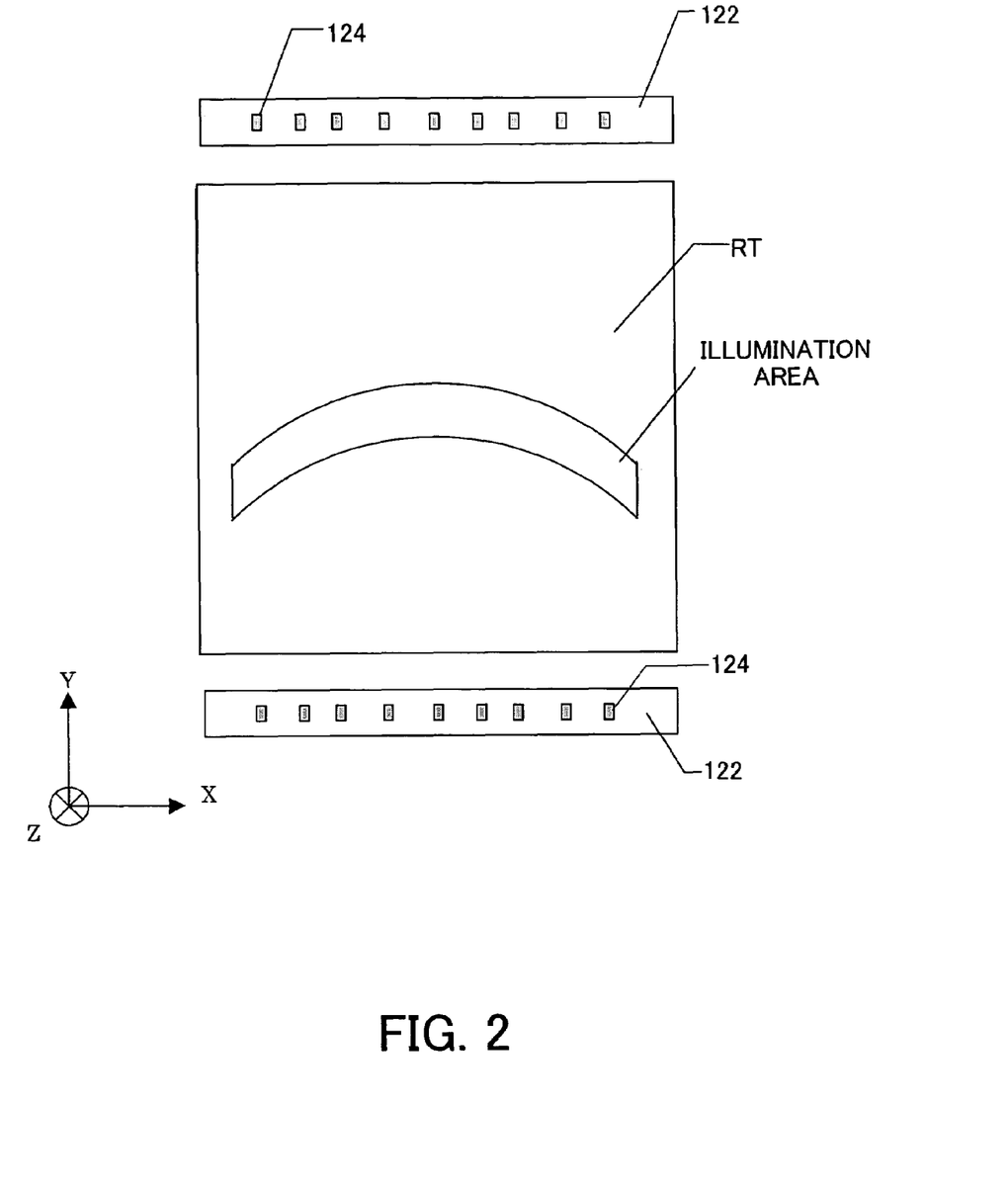
FIG. 2 is a schematic plane view showing a relationship between a reticle and a R-side reference plate placed on the reticle stage.

A reticle-side reference plate (referred to as a "R-side reference plate" hereinafter) 122 is provided, as shown in FIG. 2, in a predetermined area near the reticle RC on the reticle stage so that the pattern surface of the R-side reference plate 122 is approximately level with the pattern surface of the reticle RC. This embodiment arranges two R-side reference plates 122 in the Y direction (or scan direction) holding the reticle RT. Here, FIG. 2 is a schematic plane view showing an arrangement relationship between the reticle RT and the R-side reference plate 122 placed on the reticle stage 120.

A plurality of reticle marks (or reference marks) 124 are formed by metal, such as Cr and Al, on the pattern surface of the R-side reference plate 122. The instant embodiment approximately linearly aligns plural reticle marks 124 along the longitudinal direction of the R-side reference plate 122 (or X direction).

Figure 3:
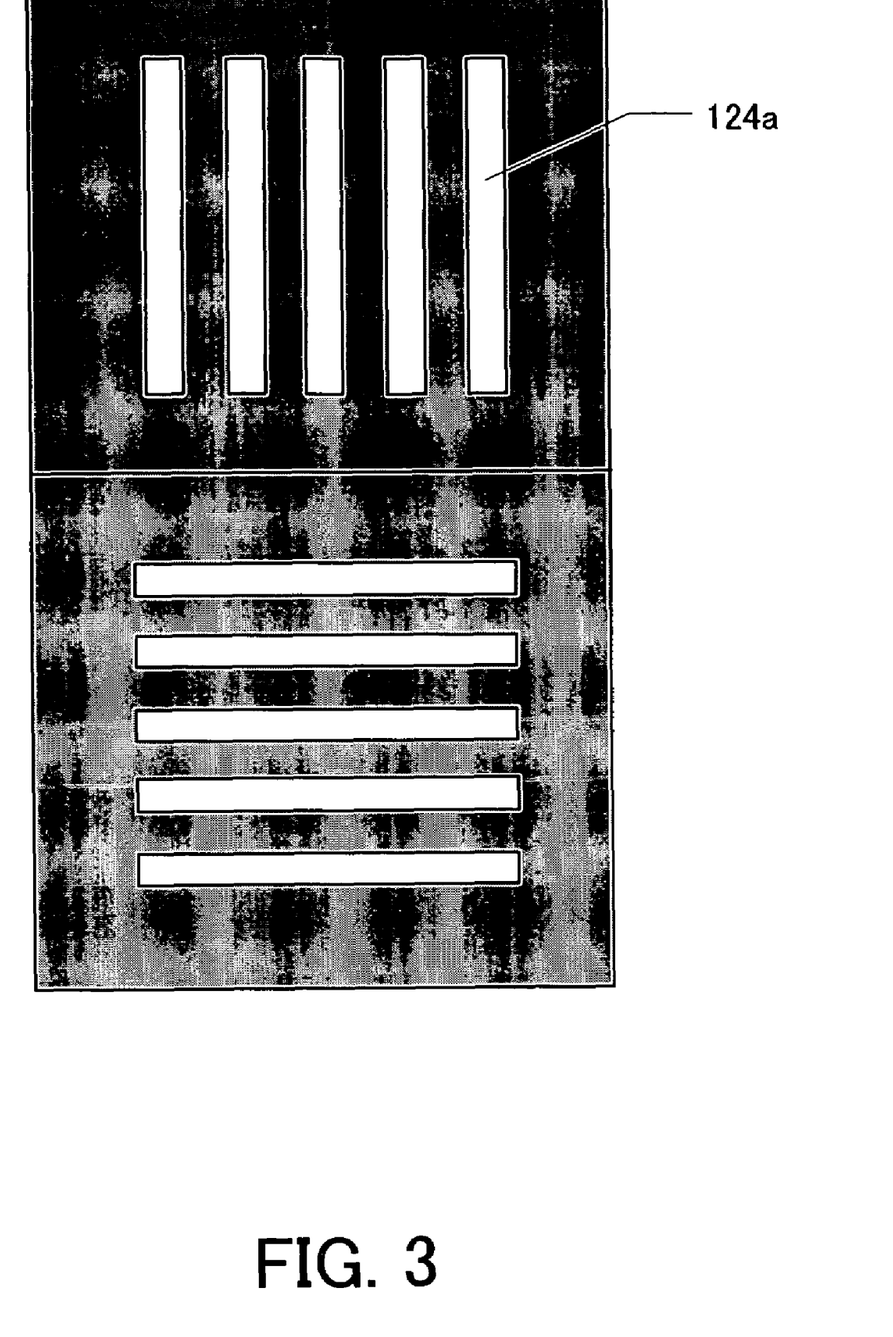
FIG. 3 is a schematic plane view showing one exemplary reticle mark.

The reticle marks 124 include, for example, a line and space pattern shown in FIG. 3, which has strip openings 124a having a size near the resolvable critical dimension (the size at the reticle side). Here, FIG. 3 is a schematic plane view of one example of the reticle mark 124.

The reticle stage 120 is driven while its position in the optical-axis direction (or Z direction) is maintained constant relative to the projection optical system 130. A moving mirror that reflects a beam from a laser interferometer is fixed onto the reticle stage 120, and the laser interferometer sequentially measures a position and moving amount of the reticle stage 120.

The projection optical system 130 serves to image diffracted light from a pattern on the reticle RT onto the wafer WF. The projection optical system 130 may use an optical system including plural lens elements, an optical system including plural lens elements and at least one concave mirror (a catadioptric optical system), an optical system including plural lens elements and at least one diffractive optical element such as a kinoform, a full mirror type optical system, and so on. Any necessary correction of the chromatic aberration may use plural lens units made from glass materials having different dispersion values (Abbe values), or arrange a diffractive optical element such that it disperses in a direction opposite to that of the lens unit.

The wafer WF is an object to be exposed, onto which a photoresist is applied. The wafer WF broadly covers a liquid crystal substrate and other objects to be exposed.

The wafer stage 140 supports the wafer WF, is connected to a drive mechanism, and controls driving of the wafer WF. The drive mechanism (not shown) drives the wafer stage 140 in six axes, i.e., in the optical-axis direction of the projection optical system 130, the plane orthogonal to the optical-axis direction (XY plane), and rotations around the optical axis (θ), and adjusts the tilt of the wafer WF relative to the image surface.

A wafer-side reference plate (referred to as a "W-side reference plate" hereinafter) 142 is provided in a predetermined area near the wafer WF on the wafer stage 140 so that the pattern surface of the W-side reference plate 142 is approximately level with the top surface of the wafer W (or an imaging surface of the projection optical system 130).

A plurality of wafer marks (or reference marks) 144 are formed by metal, such as Cr and Al, on the pattern surface of the W-side reference plate 142. The instant embodiment approximately linearly aligns plural reticle marks 124 along the longitudinal direction of the R-side reference plate 122 (or X direction). The wafer marks 144 include, for example, a line and space pattern that has strip openings having a size near the resolvable critical dimension (the size of the wafer side). Since the wafer mark 144 is similar to the above reticle mark 124, a detailed description thereof will be omitted.

A moving mirror that reflects a beam from a laser interferometer is fixed onto the wafer stage 140, and the laser interferometer sequentially measures a position and moving amount of the wafer stage 140.

The focus/leveling detecting system 150 is a wafer surface position detecting means of an oblique incident system, and includes an illumination section 152 that irradiates illumination light in an oblique direction onto the wafer WF (or the W-side reference plate) onto which a pattern of the reticle RT is transferred, and a detector 154 that detects the reflected light obliquely reflected from the wafer WF (or the W-side reference plate).

The detector 154 includes plural position detecting light-receiving elements corresponding to respective reflected lights so that the light-receiving surface of each light-receiving element is approximately conjugate with the reflecting point of each reflected light from the wafer WF. Therefore, a positional offset of the wafer WF (or the W-side reference plate 142) in the optical-axis direction of the projection optical system 130 is detected as a positional offset on the light-receiving element in the detector 154.

Since the focus/leveling detecting system 150 provides the detector 154 with plural light-receiving elements, the focus/leveling detecting system 150 can measure not only the focus but also leveling (or tilt). In other words, the focus/leveling detecting system 150 measures the tilt of the wafer (or W-side reference plate 142) from focus measurement results at plural measuring points.

When relative origin offsets occur among plural measuring points in the focus/leveling detecting system 150, an offset occurs between the exposed image surface and the top surface of the wafer WF. Therefore, it is necessary to calibrate the measuring points regularly.

Figure 4:
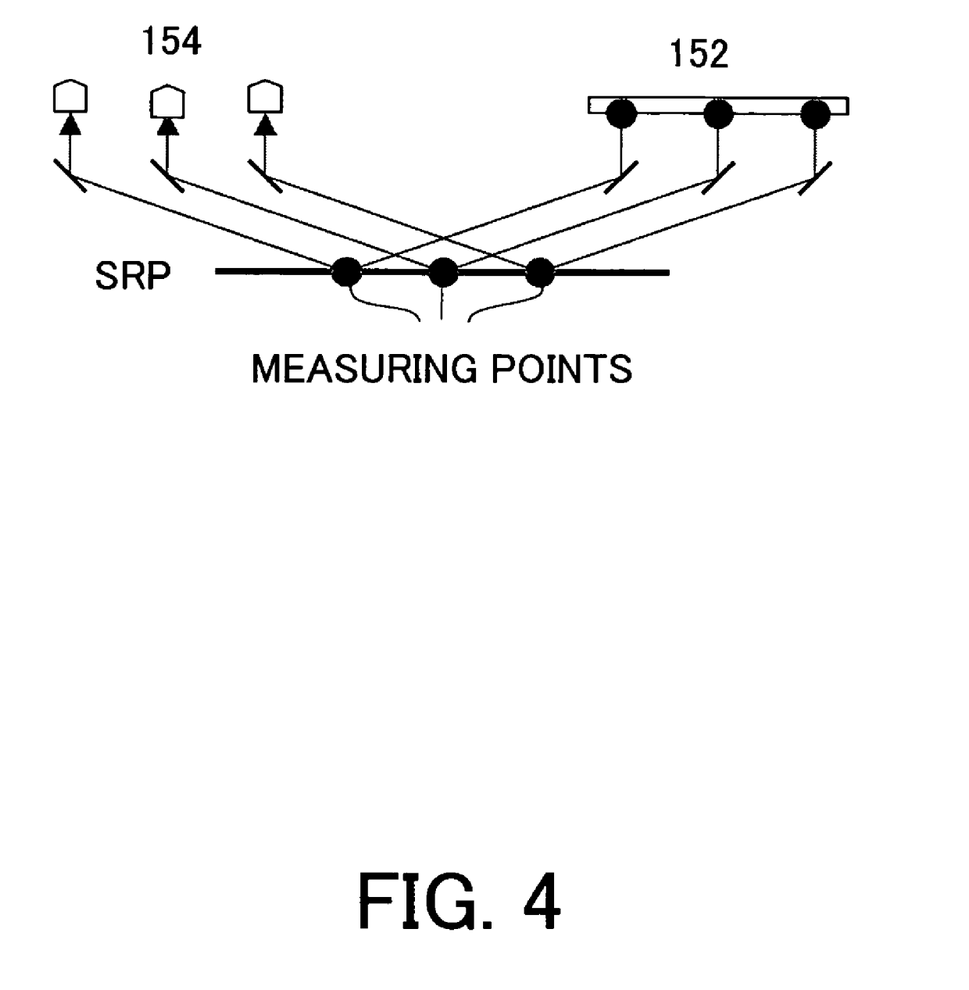
FIG. 4 is a view for explaining a calibration of a measuring point in a focus/leveling detecting system that uses a reference surface.

In calibrating the measuring points of the focus/leveling detecting system 150, it is preferable as shown in FIG. 4 that the illumination section 152 illuminates the illumination light oblique to a reference surface SRP, and the detector 154 detects the reflected light obliquely from the reference surface SRP. However, a provision of the reference surface SRP on the wafer stage 140 would increase the apparatus cost, and deteriorate the calibration accuracy of the reference surface SRP due to the influence of the leveling of the reflecting surface, and cause other problems. Here, FIG. 4 is a view for explaining the calibration of the measuring points in the focus/leveling detecting system that uses the reference surface SRP.

Figure 5A:
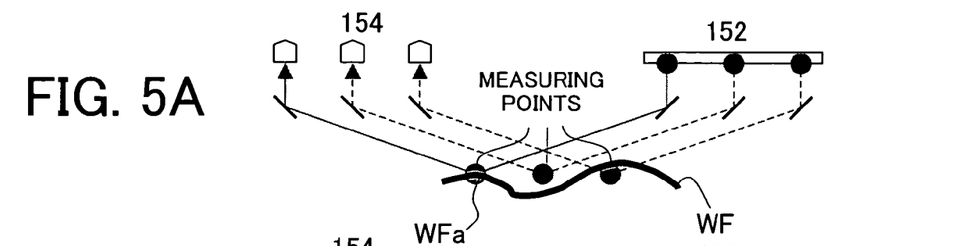
FIGS. 5A, 5B and 5C are views for explaining a correction of a measuring point in the focus/leveling detecting system in an exposure apparatus shown in FIG. 1.
Figure 5B:
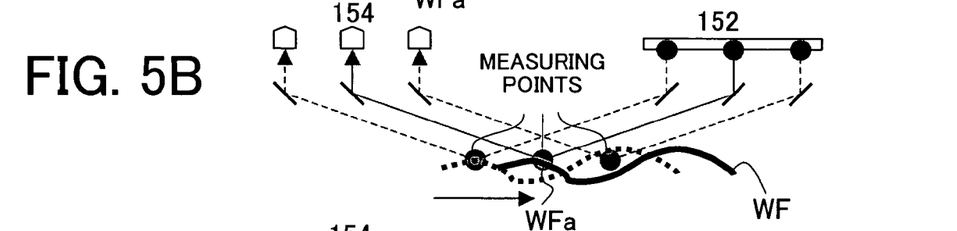
Figure 5C:
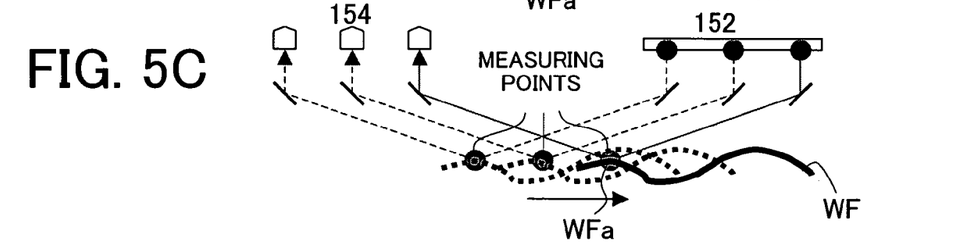

For tilt calibration of the wafer stage's running surface reference, the exposure apparatus of the instant embodiment attempts to measure the same height by the same measuring value by sequentially changing a position of the wafer WF using the wafer stage 140, as shown in FIGS. 5A to 5C, in particular, by sequentially feeding the same point WFa to the plural measuring points of the focus/leveling detecting system 150. When a relationship between the exposed image surface and the tile of the running surface of the wafer stage 140 changes with time, the reference surface calibration of the focus/leveling detecting system 150 undesirably offsets. Here, FIGS. 5A–5C are views for explaining the calibration of the measuring points of the focus leveling detecting system 150 in the exposure apparatus 100 shown in FIG. 1.

Therefore, in order to realize the focus control with high precision, it is necessary to regularly calibrate the relative tilt between the wafer stage's running surface and the exposed image surface. In order to measure the relative tilt between the wafer stage's running surface and the exposed image surface, the exposure apparatus 100 utilizes the TTL optical system (not shown).

The TTL optical system (not shown) includes, for example, a light source that is substantially the same as the exposure light source, i.e., a light source that emits the light having the substantially the same wavelength as that of the exposure light, a fiber that introduces the light from the light source to the illuminating section, an illuminating section that illuminates the reticle mark 124 on the R-side reference plate 122, and a sensor IS that detects the light intensity of the light that transmits the wafer mark 144 on the W-side reference plate 142.

Figure 6:
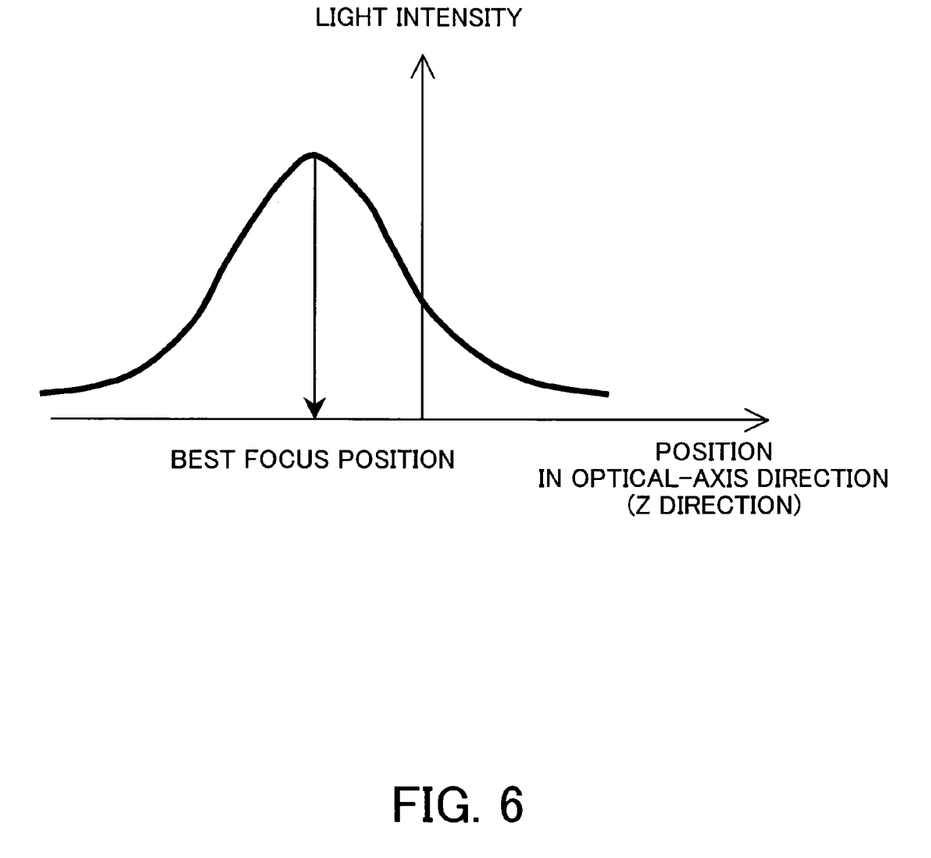
FIG. 6 is a graph showing the light intensity of the light that transmits a wafer mark detected by a TTL optical system.

A description will now be given of the focus measurements by the TTL optical system. First, the reticle stage 120 is driven so that the reticle mark 124 is set at the predetermined image point in the exposure area. Next, the wafer stage 140 is driven so that the wafer mark 144 is set near the imaging position of the reticle mark 124. While the wafer stage 140 is driven in the optical-axis direction (or the Z direction) of the projection optical system 130, the light intensity of the light that transmits the wafer mark 144 is detected. The best focus position of the projection optical system 130 at the predetermined image point can be obtained by detecting a position in the Z direction, which provides the maximum light intensity. FIG. 6 is a graph showing the light intensity of the light that transmits the wafer mark 144, which is detected by the TTL optical system, where the ordinate axis denotes the light intensity, and the abscissa axis denotes a position in the optical-axis direction (or the Z direction).

Figure 7A:
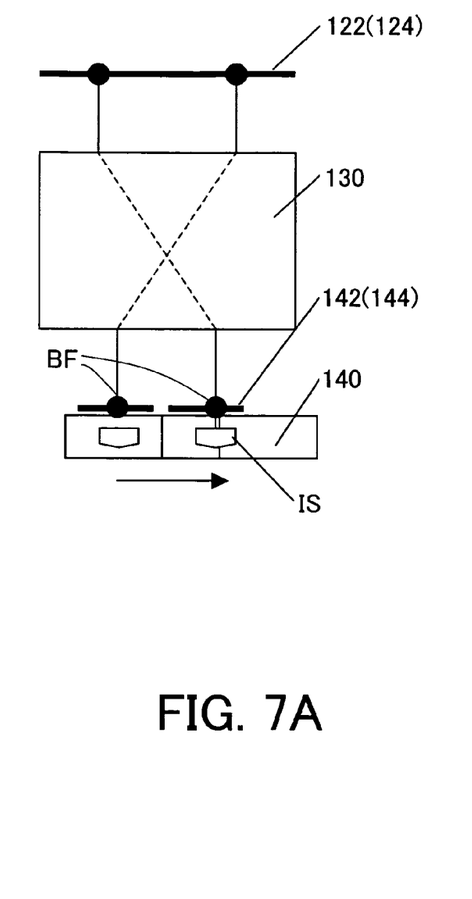
FIGS. 7A and 7B are views for explaining a measuring method of an offset between a wafer stage's running surface and a projection optical system's imaging surface.
Figure 7B:
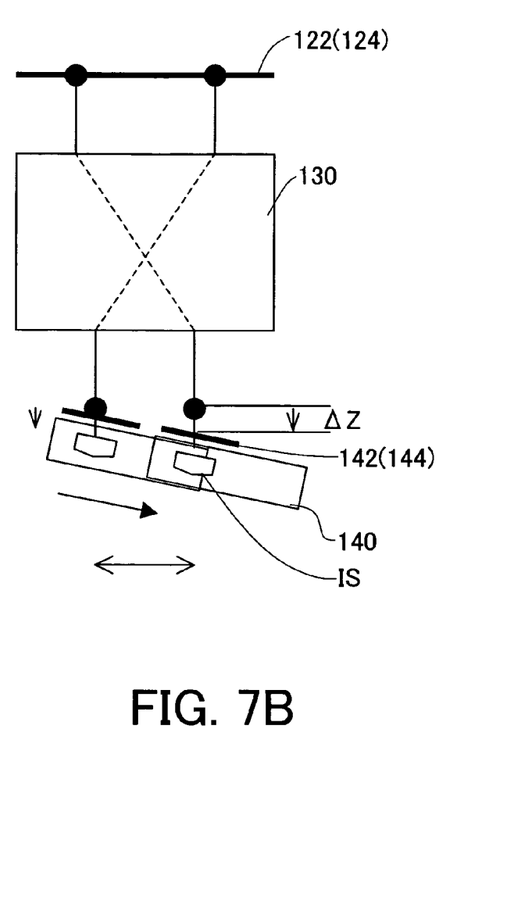

FIGS. 7A and 7B are views for explaining a method for measuring an offset between the running surface of the wafer stage 140 and the imaging surface of the projection optical system 130. In FIGS. 7A and 7B, BF denotes the best focus positions of the projection optical system 130 at plural points (two points in this embodiment) in the exposure area.

When the wafer-side imaging surface and the wafer stage 140's running surface accord with the R-side reference plate 122 (reticle mark 124), the best focus position BF accords with the wafer-side reference plate 142 (or the wafer mark 144) as shown in FIG. 7A.

On the other hand, when the wafer-side imaging surface and the wafer stage 140's running surface offset from the R-side reference plate 122 (reticle mark 124), the best focus position BF does not accord with the wafer-side reference plate 142 (or the wafer mark 144) as shown in FIG. 7B. In this embodiment, the focus measurement value at the right image point shown in FIG. 7B has an offset value $\Delta Z$. Once an image point difference or a relationship between the running amount and the offset value $\Delta Z$ is calculated, the tilt of the running surface to the wafer-side image surface can be calculated. When the tilt of the calculated running surface is added to the running surface information, the wafer-side image surface can be accorded with the wafer stage 140's running surface.

In driving the wafer stage 140, a position monitor means (not shown), such as a laser interferometer, a linear encoder, and a displacement sensor, monitors the wafer stage 140's position in the Z direction so as to control the running surface of the wafer stage 140. While the wafer stage 140's position is monitored in the Z direction, the same sensor IS measures the best focus position by moving the wafer stage 140 at the two measuring points, and the wafer stage 140's running surface can be calibrated.

Figure 8A:
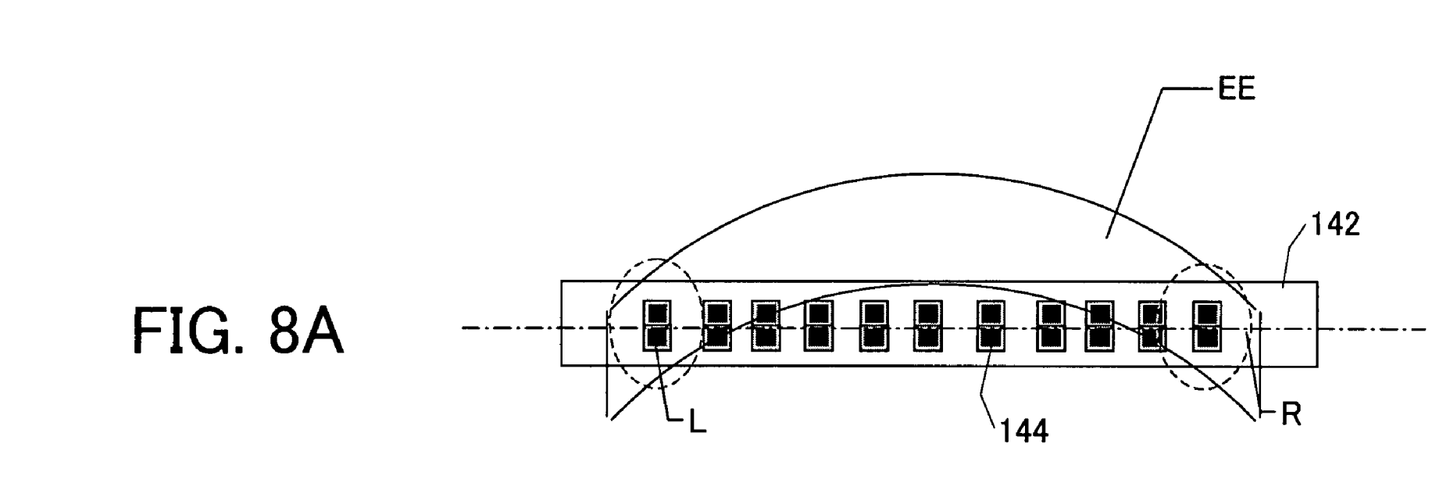
FIGS. 8A and 8B are views for explaining a focus measurement with an arc-shaped exposure area.
Figure 8B:
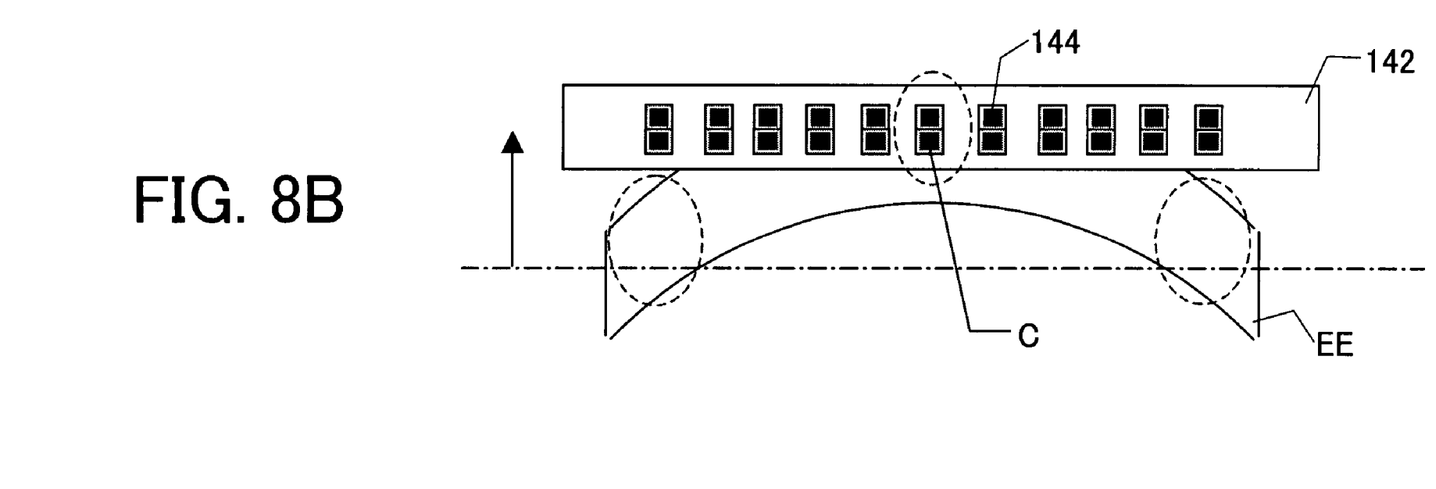

Referring now to FIGS. 8A and 8B, a description will be given of the focus measurement in the scan direction. FIGS. 8A and 8B show an embodiment that has an arc-shaped exposure area EE, and measures the focus at three points L, C and R in the exposure area EE.

The reticle stage 120 is moved in the Y direction so that the points L and C are located in the exposure area EE. As shown in FIG. 8A, the wafer stage 140 is driven so that the wafer mark 144 is set at the exposure points L and R and then the focus is measured at these points.

After the focus measurements at the points L and R ends, the reticle stage 120 is driven in the Y direction so that the point C can be the predetermined image point in the Y direction in the exposure area EE as shown in FIG. 8B. Similar to the above embodiment, the wafer stage 140 is driven, and the same sensor measures the focus at the point C using the same wafer mark 142. The leveling of the exposed image surface can be calculated through the focus measurements at three image points that form a plane in the exposure area EE. The prior art cannot obtain the leveling of the exposed image surface unless the reticle marks that form a plane are provided on the R-side reference plate, causing the large size of the R-side reference plate. On the other hand, the instant embodiment linearly arranges the reticle marks 124 on the R-side reference plate 122, and achieves the miniaturization. In addition, the instant embodiment drives the reticle stage 120, and feeds it to a necessary measuring image point for focus measurements at multiple points so that the image surface can be measured at an arbitrary position.

Figure 9A:
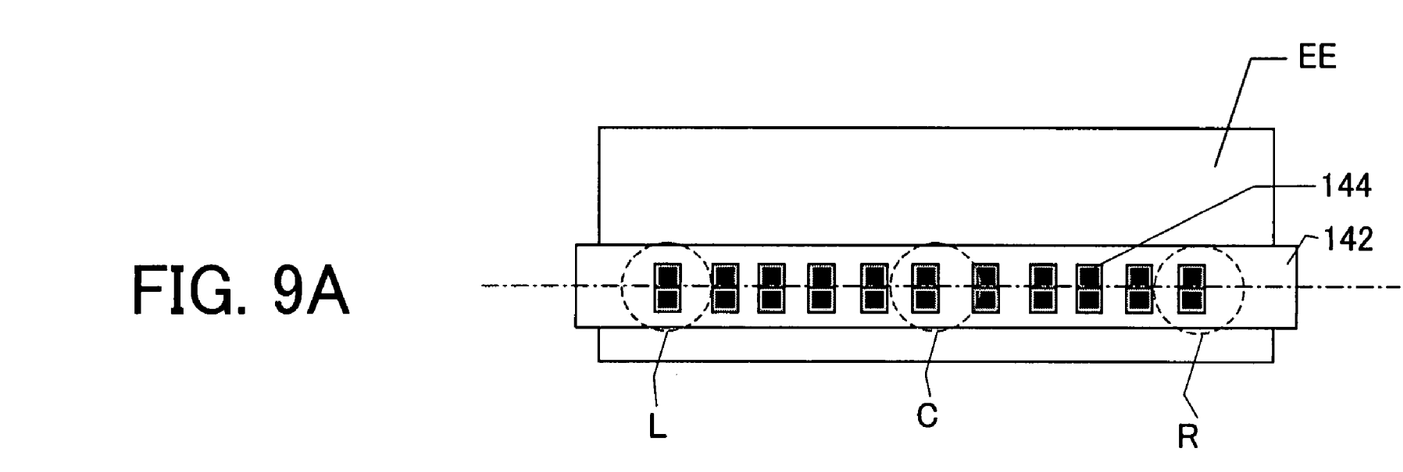
FIGS. 9A and 9B are views for explaining a focus measurement with a rectangular exposure area.
Figure 9B:
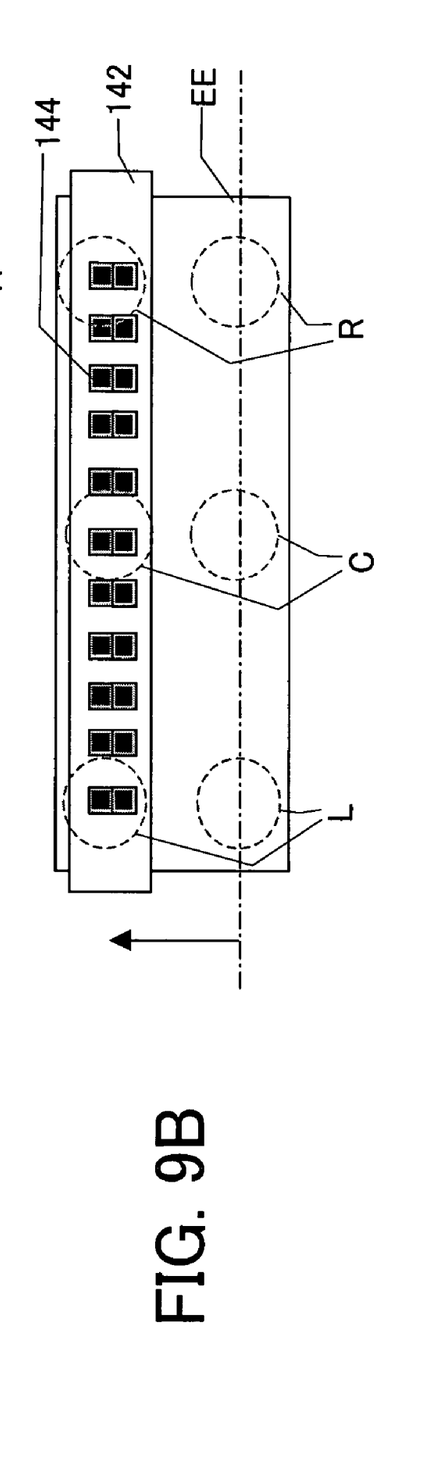

As shown in FIGS. 9A and 9B, when the exposure area EE is a rectangular shape, the reticle marks 124 approximately linearly arranged on the R-side reference plate 122 in the X direction can be simultaneously set in the exposure area EE, and the focus measurements at three or more measuring points are available at the same image point.

For the tilt measurement in the Y direction, as the reticle stage 120 is driven in the Y direction, different image points in the Y direction in the exposure area EE and the focus measurement at plural measuring points in the X direction are available. Therefore, the highly precise tilt measurement is available.

Figure 10:
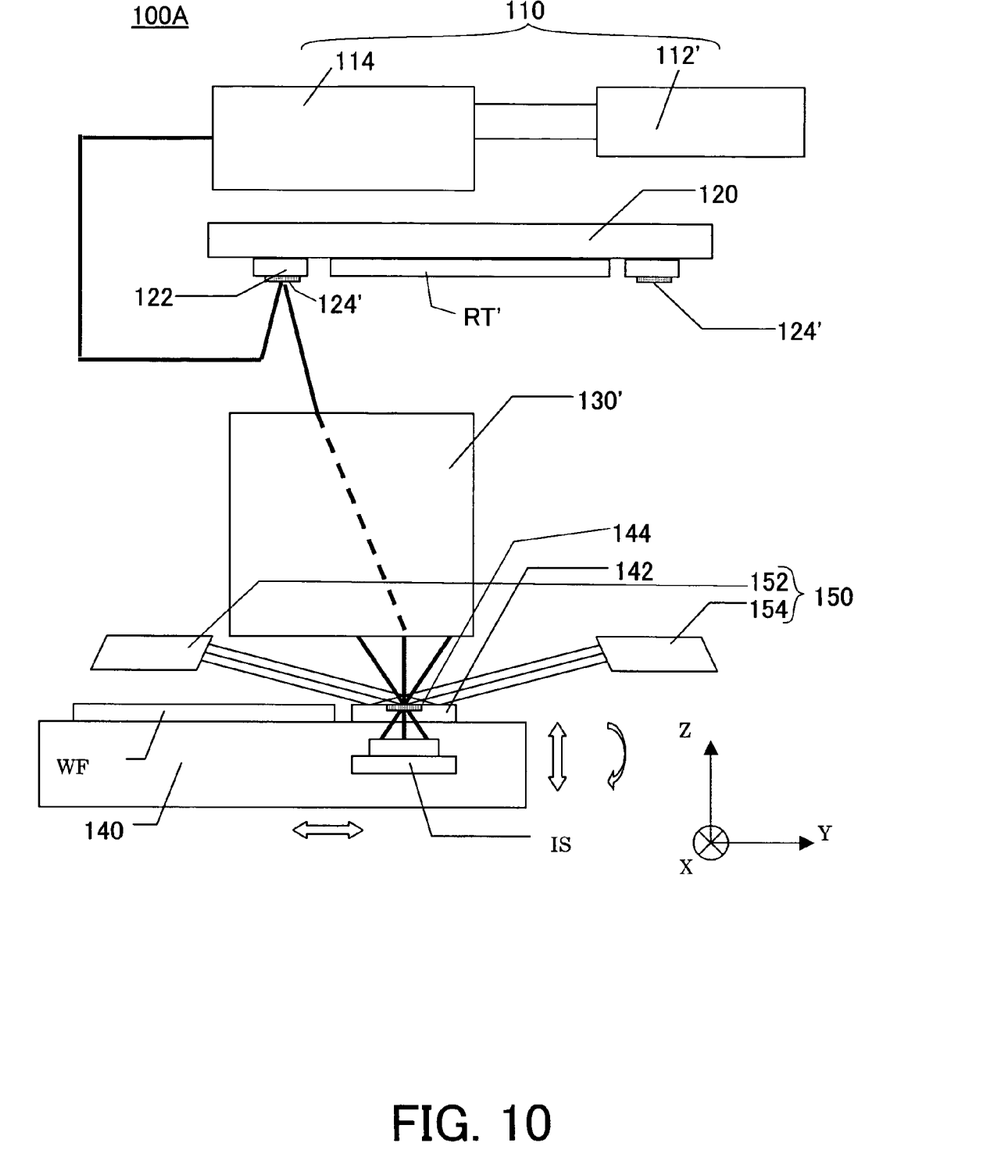
FIG. 10 is a schematic block diagram of a structure of a variation of the exposure apparatus shown in FIG. 1.

Not only the exposure apparatus 100 that utilizes the transmission reticle RT but also the exposure apparatus 100A that utilizes a reflection reticle RT' and a light source section 112' that emits extreme ultraviolet ("EUV") light, such as a X-ray ("EUV exposure apparatus" hereinafter) can calibrate the exposed image surface and the wafer stage 140's running surface as described above by approximately linearly arranging plural reflection reticle marks 124' on the R-side reference plate 122. Here, FIG. 10 is a schematic block diagram showing a structure of the exposure apparatus 100A as a variation of the exposure apparatus 100 shown in FIG. 1.

In addition, the EUV exposure apparatus 100A includes the projection optical system 130 of a reflective optical element, i.e., a mirror, and does not basically generate chromatic aberration. The light for calibration does not have to be the light having the same wavelength as that of the exposure light source. Therefore, when it is difficult to provide a wafer mark 144 that transmits the EUV light, another light source may be provided for a calibration light source that has a longer wavelength than the exposure wavelength, and compatible with the wafer mark 144. Such a light source includes a harmonic laser, such as a KrF excimer laser having a wavelength of about 248 nm and a YAG laser having a wavelength of about 266 nm.

In exposure, light emitted from the light source section 112, for example, Koehler-illuminates the reticle RT via the illumination optical system 114. The light that has passed the reticle RT and reflects the reticle pattern forms an image on the wafer WF through the projection optical system 130. The exposure apparatuses 100 accords exposed image surface of the projection optical system 130 with the wafer stage 140's running surface, and realizes highly precise focus calibration. Therefore, the exposure apparatus 100 can provide higher quality devices (such as semiconductor devices, LCD devices, image pick-up devices (such as CCDs), and thin film magnetic heads) than the conventional.

Figure 11:
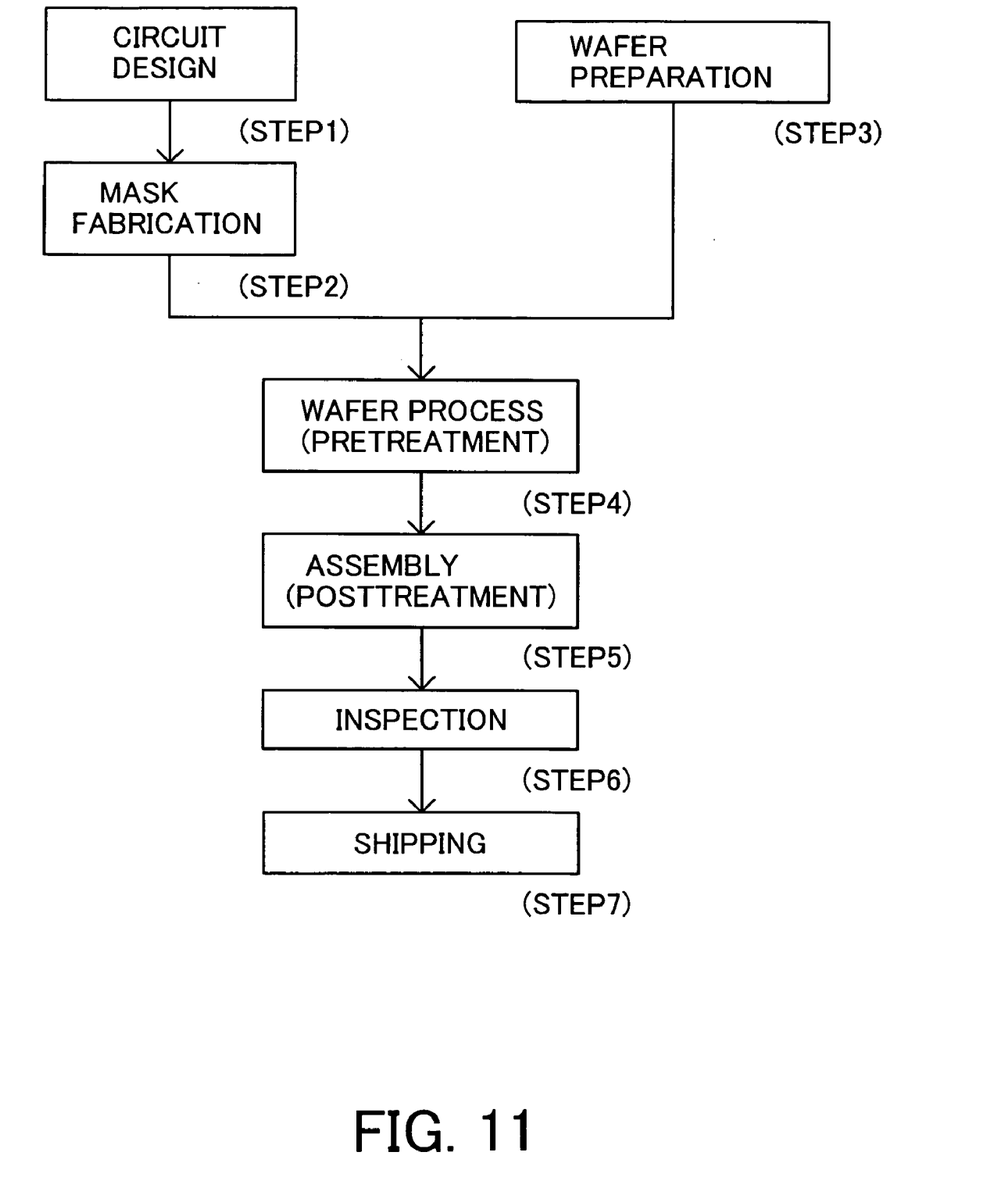
FIG. 11 is a flowchart for explaining a method for fabricating devices (semiconductor chips such as ICs, LSIs, and the like, LCDs, CCDs, etc.).
Figure 12:
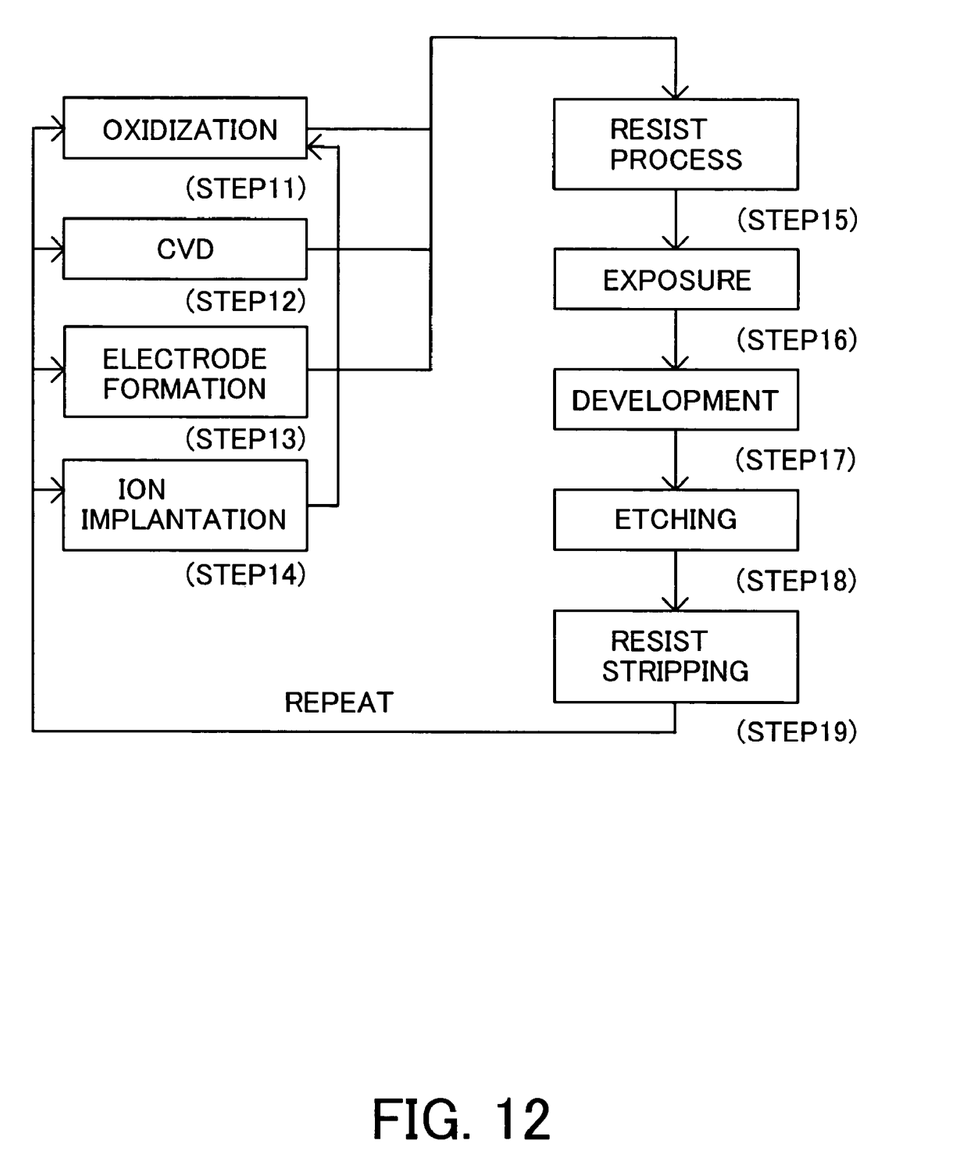
FIG. 12 is a detailed flowchart for Step 4 of wafer process shown in FIG. 11.

Referring to FIGS. 11 and 12, a description will now be given of an embodiment of a device manufacturing method using the above exposure apparatus 100. FIG. 11 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacture method of the present invention may manufacture higher quality devices than the conventional one. Thus, the device manufacturing method using the inventive lithography, and resultant devices themselves as intermediate and finished products also constitute one aspect of the present invention.

Thus, the present invention can provide an exposure apparatus that realizes a highly precise focus calibration by measuring a tilt of an image surface in a scan direction, and provides exposure with a superior resolution without lowering a throughput.

Further, the present invention is not limited to these preferred embodiments, and various modifications and changes may be made in the present invention without departing from the spirit and scope thereof.

This application claims foreign priority benefits based on Japanese Patent Application No. 2003-417052, filed on Dec. 15, 2003, which is hereby incorporated by reference herein in its entirety as if fully set forth herein.

What is claimed is:

1. An exposure apparatus comprising:
   a projection optical system for projecting a pattern on a reticle mounted on a first stage onto an object mounted on a second stage;
   a first reference plate provided on the reticle or a surface equivalent to the reticle, said first reference plate having three or more first reference marks each of which serves as a reference for an alignment between the reticle and the object;
   a measuring unit for measuring focus position at imaging positions of the first reference marks and for measuring an image surface of said projection optical system; and
   a correcting unit for correcting a relationship between the image surface and a reference surface as a reference of a measurement by said measuring unit.

2. An exposure apparatus according to claim 1, wherein said exposure apparatus synchronously scans the reticle and the object, and exposes the pattern onto the object via said projection optical system.

3. An exposure apparatus according to claim 2, wherein the first reference marks form a plane; and
   said measuring unit measures a tilt of the image surface in a scan direction and/or in a direction orthogonal to the scanning direction.

4. An exposure apparatus according to claim 2, wherein said first reference marks are linearly aligned with a direction orthogonal to a scan direction; and
   wherein said measuring unit measures the focus position at plural different positions in the scan direction within an effective view angle of said projection optical system, and measures a tile of the image surface in the scan direction.

5. An exposure apparatus according to claim 1, further comprising:
   a second reference plate provided on a surface equivalent to the object, said second reference plate having a second reference mark that serves as a reference for an alignment between the reticle and the object; and
   a feeder for sequentially feeding the second reference marks to imaging positions of the first reference marks.

6. An exposure apparatus according to claim 5, further comprising a sensor for detecting a light intensity of light that transmits the first reference mark and the second reference mark when the first reference mark and the second reference mark are relatively scanned in an optical-axis direction of said projection optical system.

7. An exposure apparatus according to claim 2, wherein said projection optical system has an arc-shaped effective exposure area; and
   wherein said measuring unit measures the focus positions at plural points within the effective exposure area, and measures a tilt of the image surface in a scan direction and a direction orthogonal to the scan direction.

8. An exposure apparatus according to claim 2, wherein said projection optical system has a rectangular effective exposure area; and
   wherein said measuring unit measures the focus position at plural points within the effective exposure area, and measures a tilt of the image surface in a scan direction and a direction orthogonal to the scan direction.

9. An exposure apparatus according to claim 2, wherein said correcting unit corrects a relationship between a tilt of the image surface in a scan direction and a direction orthogonal to the scan direction, which is measured by the measuring means, and a running surface of the first and second stages.

10. An exposure apparatus according to claim 1, wherein said measuring unit measures the first reference mark with light having the same wavelength as an exposure wavelength.

11. An exposure apparatus according to claim 1, wherein said measuring unit measures the first reference mark with light having a different wavelength from an exposure wavelength.

12. An exposure apparatus according to claim 1, wherein exposure light for illuminating a pattern formed on the reticle has a wavelength of 20 nm or smaller, and wherein said measuring means measures the first reference mark with light having a different wavelength from an exposure wavelength.

13. A device manufacturing method comprising the steps of:

exposing an object using an exposure apparatus according to claim 1; and developing the object that has been exposed.

* * * * *